United States Patent [19]

Moriuchi et al.

[11] Patent Number: 5,101,258

[45] Date of Patent: Mar. 31, 1992

[54] SEMICONDUCTOR INTEGRATED CIRCUIT DEVICE OF MASTER SLICE APPROACH

[75] Inventors: Shigeru Moriuchi; Masashi Takeda; Takayuki Mogi; Hiroaki Anmo, all of Kanagawa, Japan

[73] Assignee: Sony Corporation, Tokyo, Japan

[21] Appl. No.: 476,606

[22] Filed: Feb. 7, 1990

[30] Foreign Application Priority Data

| Feb. 9, 1989 | [JP] | Japan | 1-30578 |
| Feb. 9, 1989 | [JP] | Japan | 1-30579 |
| Feb. 10, 1989 | [JP] | Japan | 1-31977 |
| Feb. 16, 1989 | [JP] | Japan | 1-37003 |

[51] Int. Cl.⁵ .................................. H01L 27/04
[52] U.S. Cl. ..................... 357/45; 357/43; 357/59; 357/35; 357/51
[58] Field of Search ............ 357/41, 43, 45, 45 M, 357/59 F, 35, 51

[56] References Cited

U.S. PATENT DOCUMENTS

| 4,579,600 | 4/1986 | Shah et al. ................. 357/59 F |
| 4,682,202 | 7/1987 | Tanizawa ..................... 357/45 |
| 4,748,488 | 5/1988 | Suzuki et al. ................ 357/45 |
| 4,949,153 | 8/1990 | Hirao et al. .................. 357/43 |

FOREIGN PATENT DOCUMENTS

| 0290672 | 11/1988 | European Pat. Off. .......... 357/43 |
| 3634850A1 | 4/1987 | Fed. Rep. of Germany . |
| 0087854 | 5/1983 | Japan ........................ 357/45 M |
| 0219555 | 9/1987 | Japan ........................ 357/43 |
| 0263671 | 11/1987 | Japan ........................ 357/43 |
| 0080559 | 4/1988 | Japan ........................ 357/43 |
| 0186462 | 8/1988 | Japan ........................ 357/43 |
| WO89/04553 | 5/1989 | PCT Int'l Appl. . |

OTHER PUBLICATIONS

IBM Technical Disclosure Bulletin, vol. 27, No. 11, Apr., 1985, "Diagonal Layout of Gate Array", pp. 6727-6728.

8107 I.E.E.E. Journal of Solid State Circuits, SC-21 (1986) Oct., No. 5, "A Bipolar 18K-Gate Variable Size Cell Masterslice" by Takashi Nishimura et al., pp. 727-732.

8032 Electronics 59 (1986) Sep., No. 30, "Fairchild's Radical Process For Building Bipolar VLSI", pp. 55-59.

8032 Electronics, 61 (1988) Feb. 4, No. 3, "LSI Logic Arrays Boost Both Drive and Density", by Samuel Weber, pp. 63-64.

*Primary Examiner*—Rolf Hille
*Assistant Examiner*—Tan Ho
*Attorney, Agent, or Firm*—Hill, Van Santen, Steadman & Simpson

[57] ABSTRACT

In a semiconductor integrated circuit device of master slice approach according to this invention, regions on basic elements which are not used and isolation areas serve as wiring regions. Resistive elements are formed on the regions on the basic elements which are not used and the isolation areas. A high integration level can be obtained, circuit layout can be facilitated, and versatility of circuit design can be improved.

13 Claims, 9 Drawing Sheets

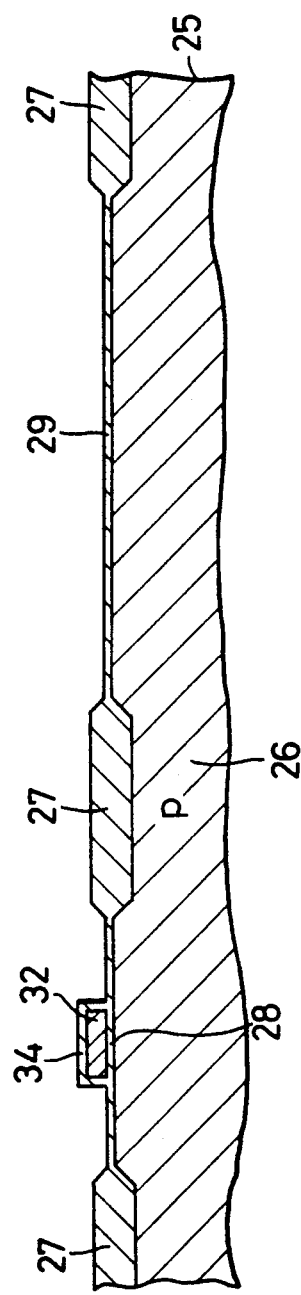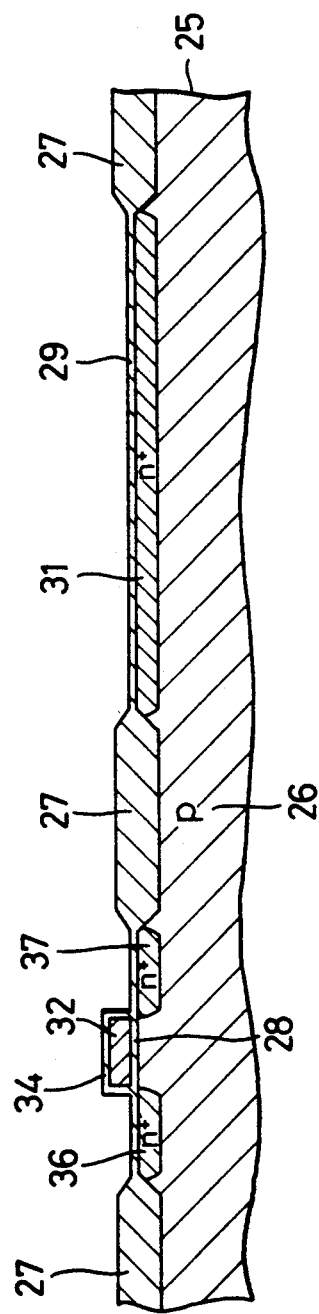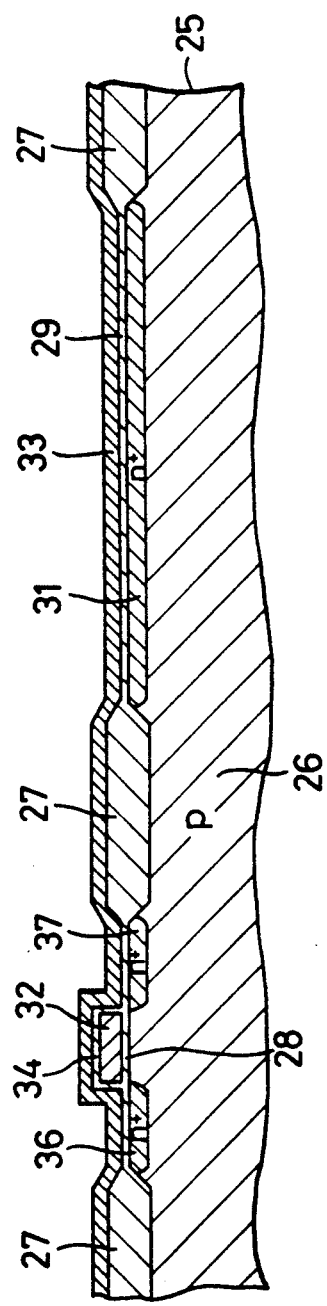
FIG. 13A
FIG. 13B
FIG. 13C

SEMICONDUCTOR INTEGRATED CIRCUIT DEVICE OF MASTER SLICE APPROACH

BACKGROUND OF THE INVENTION

1. Field of the Invention

The present invention relates to a semiconductor integrated circuit device of master slice approach which includes bipolar transistors and the like as basic elements.

2. Description of the Prior Art

A first conventional example of a master slice approach which includes a bipolar transistor element as a basic element is shown in FIG. 1.

In the first conventional example, peripheral cells 12 are arranged in a peripheral portion of a semiconductor chip 11, and internal cells 13 as island regions are surrounded by the peripheral cells 12. Therefore, portions around the internal cells 13 constitute wiring regions 14.

In one island-like internal cell 13, npn bipolar transistor elements 15, pnp bipolar transistor elements 16, MIS capacitive elements 17, resistive elements 18 formed by impurity diffusion layers, and the like are formed, as shown in FIG. 2. In each internal cell 13, the elements 15 to 18 and the like are optimally arranged in accordance with its application purpose.

A master slice including a bipolar transistor as a basic element is not limited to the bipolar master slice described above, but can be exemplified by a Bi-MOS master slice, a Bi-CMOS master slice (Nikkei Electronics, 1988.4.18 (No. 445), pp. 227–241). All these conventional master slices have the structures shown in FIGS. 1 and 2.

In the first conventional example described above, each internal cell 13 is optimized for a specific purpose, but does not have versatility. The region of the internal cell 13 and the wiring regions 14 are fixed. For this reason, systematic, optimal circuit design cannot be achieved, and a wasteful region is undesirably formed.

In addition, the wiring regions 14 are regions for only wiring, and the elements 15 to 18 are not formed in the wiring regions 14 at all. Therefore, a high integration level cannot be obtained in the first conventional example described above.

As is apparent from FIG. 2, the bipolar transistors 15 and 16 are not generally formed to be adjacent to the resistive elements 18. For this reason, the layout of the elements 15 to 18 cannot comply with a descriptive image of circuit design. Therefore, it is not easy to obtain an optimal circuit layout.

In addition, when each resistive element 18 is formed as a diffusion resistor in a semiconductor substrate, the integration level of the basic elements 15 to 17 except for the resistive elements 18 is naturally low.

When the resistive elements 18 are formed as diffusion resistors in the semiconductor substrate, the layout of the resistive elements 18 and their resistances cannot be optimized in individual circuits. For example, several resistive elements 18 are required in a master slice to obtain one resistive element in the circuit design description. As a result, the region of the resistive elements 18 and the region of the basic elements 15 to 17 except for the resistive elements 18 are unbalanced, and effective utilization of the total region for the basic elements 15 to 18 is undesirably prevented.

Since the layout of the resistive elements 18 and their resistances cannot be optimized in the individual circuits, it is not easy to design the circuit layout.

Other master slices shown in FIGS. 3 and 4 are conventional master slice examples including bipolar transistor elements and MOS transistor elements as basic elements.

The second conventional example shown in FIG. 3 includes bipolar transistor elements as major elements. Blocks of bipolar transistor elements 21 constituting an operational amplifier and blocks of MOS transistor elements 22 constituting an analog switch are formed on a semiconductor chip 11.

The third conventional example shown in FIG. 4 comprises MOS transistor elements as major elements. A block of MOS transistor elements 23 constituting a gate array and blocks of bipolar transistor elements 24 constituting an input/output circuit are formed on a semiconductor chip 11.

Although the second and third conventional examples are optimized for specific application purposes, a ratio of the number of bipolar transistor elements 21 and 24 to the number of MOS transistor elements 22 and 23 is fixed. For this reason, versatility in circuit design is limited in the second and third conventional examples described above.

A Bi-CMOS device or the like generally comprises at least a MOS transistor element, a MIS capacitive element, and a resistive element.

FIG. 5 shows still another example of a semiconductor device obtained by wiring a Bi-CMOS master slice as a fourth conventional example of the master slice. In order to manufacture this semiconductor device, a p-type well 26 is formed in an n-type Si substrate 25, and an $SiO_2$ film 27 is then formed as a field oxide.

The surface of the Si substrate 25 is oxidized to form an $SiO_2$ film 28 serving as a gate oxide and an $SiO_2$ film 29 serving as an insulator film of a MIS capacitive element. A resist film (not shown) is patterned, and an impurity is ion-implanted to form an $n^+$-type region 31 serving as one electrode of the MIS capacitive element.

A first poly-Si layer is patterned to form a poly-Si layer 32 serving as a gate electrode and a poly-Si layer 33 serving as the other electrode of the MIS capacitive element.

The surfaces of the poly-Si layers 32 and 33 are oxidized to form $SiO_2$ films 34 and 35. In this state, an impurity is ion-implanted to form $n^+$-type regions 36 and 37 serving as source/drain regions and an $n^+$-type region 38 serving as an electrode take-off connection of the $n^+$-type region 31.

A second poly-Si layer (not shown) is patterned to form resistive elements at predetermined positions.

Thereafter, an interlayer insulator 41 and electrode windows 42 to 45 are formed, and Al wiring layers 46 to 49 are patterned to form a MOS transistor element 51, a MIS capacitive element 52, and a resistive element (not shown).

In the conventional fabrication method described above, the poly-Si layers 32 and 33 are made of the first poly-Si layer, and the poly-Si layer 32 is used as an ion-implantation mask for forming the $n^+$-type regions 36 and 37. Therefore, the $n^+$-type region 31 under the poly-Si layer 33 cannot be simultaneously formed with the $n^+$-type regions 36 and 37.

For this reason, as described above, lithographic and ion-implantation steps for forming the $n^+$-type region 31 are required. Therefore, the above method has a large number of steps.

SUMMARY OF THE INVENTION

According to the present invention, electrical connections of only bipolar transistor elements to be used are performed through electrode windows, and regions on bipolar transistor elements which are not used are used as wiring regions, thereby freely determining an active region and the wiring region. With this arrangement, circuit design can be optimized, and a wasteful region can be eliminated. Since the regions on the bipolar transistor elements which are not used serve as wiring regions, a specific region for only wiring need not be formed. For this reason, bipolar transistor elements can also be arranged in the conventional region for only wiring, and a high integration level can be obtained.

Since a resistance layer is formed on an isolation area, the resistance layer can be formed without increasing the size of a semiconductor chip. Therefore, a high integration level can be obtained.

Since the bipolar transistor elements are adjacent to the resistor layers, the element layout can be close to a descriptive image of circuit design. Therefore, the circuit layout can also be facilitated.

The region on the resistor layer which is not used serves as a wiring region. Even if a resistor layer is formed on the isolation area, the wiring region can be assured. Therefore, the high integration level can be obtained, the circuit layout can be facilitated, and the wiring region can be assured.

Since a resistive element need not be formed in a semiconductor substrate, the integration level of basic elements except for the resistive elements can be increased.

In addition, since the resistive element can be formed on the bipolar transistor element which is not used, the resistive element need not be formed in the semiconductor substrate. Therefore, the integration level of the basic elements except for the resistive elements can be increased.

The layout of the resistive elements and their resistances can be determined without being adversely affected by the basic elements formed in the semiconductor substrate. Therefore, these elements can be optimized in each individual circuit. In addition, the circuit layout can be facilitated.

If the region on an array of bipolar transistor elements is used as a wiring region, a channel type MOS master slice can be constituted. If the region on an array of MOS transistor elements is used as a wiring region, a channel type bipolar master slice can be constituted. In addition, when bipolar and MOS transistor elements are used, a Bi-MOS master slice can be constituted. Moreover, if the above three arrangements can be used together on a single semiconductor chip, versatility of circuit design can be improved.

The gate electrode of the MOS transistor element is constituted by a first wiring layer, and the other electrode of the MIS capacitive element is constituted by a second wiring layer. The source and drain regions of the MOS transistor element and an impurity region serving as one electrode of the MIS capacitive element can be simultaneously formed upon doping of an impurity in the semiconductor substrate. In addition, the resistive element is also formed by the second wiring layer for forming the other electrode of the MIS capacitive element. Therefore, the resistive element and the other electrode of the MIS capacitive element can be simultaneously formed, thus requiring only a small number of steps.

BRIEF DESCRIPTION OF THE DRAWINGS

FIGS. 13A to 13E are side sectional views showing steps of the fifth embodiment.

DETAILED DESCRIPTION OF THE PREFERRED EMBODIMENTS

The first embodiment which exemplifies a semiconductor integrated circuit device of bipolar master slice approach will be described with reference to FIGS. 6 to 9.

Figure 6:
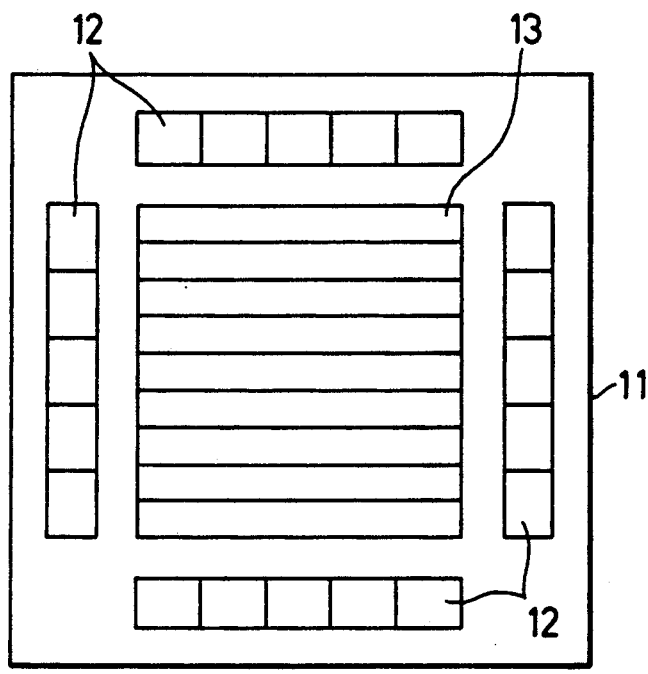
FIG. 6 is a plan view of the first embodiment and corresponds to FIG. 1.

As shown in FIG. 6, peripheral cells 12 are arranged in a peripheral portion of a semiconductor chip 11 in the first embodiment as in the conventional example. However, internal cells 13 are in contact with each other without forming gaps therebetween. Therefore, the region for only wiring is not provided in the first embodiment.

Figure 7:
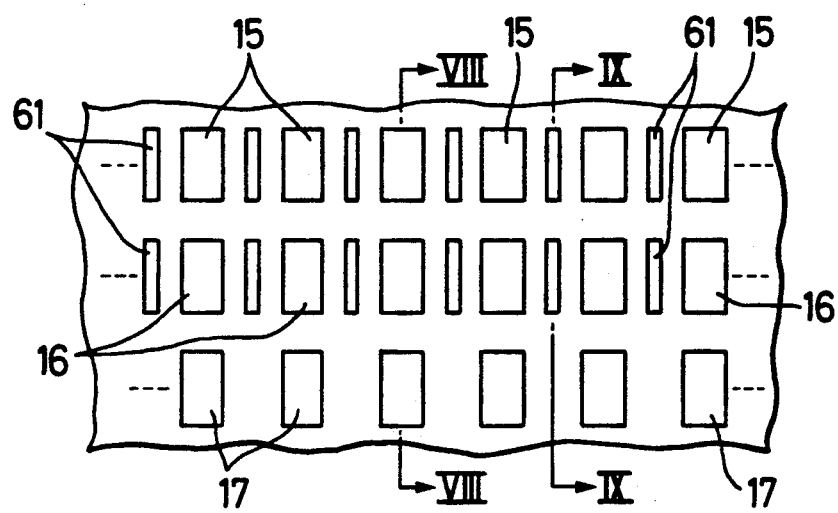
FIG. 7 is an enlarged plan view of the main part of the first embodiment and corresponds to FIG. 2.

As shown in FIG. 7, each array of the internal cell 13 comprises npn bipolar transistor elements 15 and resistive elements 61, pnp bipolar transistor elements 16 and resistive elements 61, or MIS capacitive elements 17. These arrays are repeatedly formed to constitute the entire internal cell 13.

Figure 8:
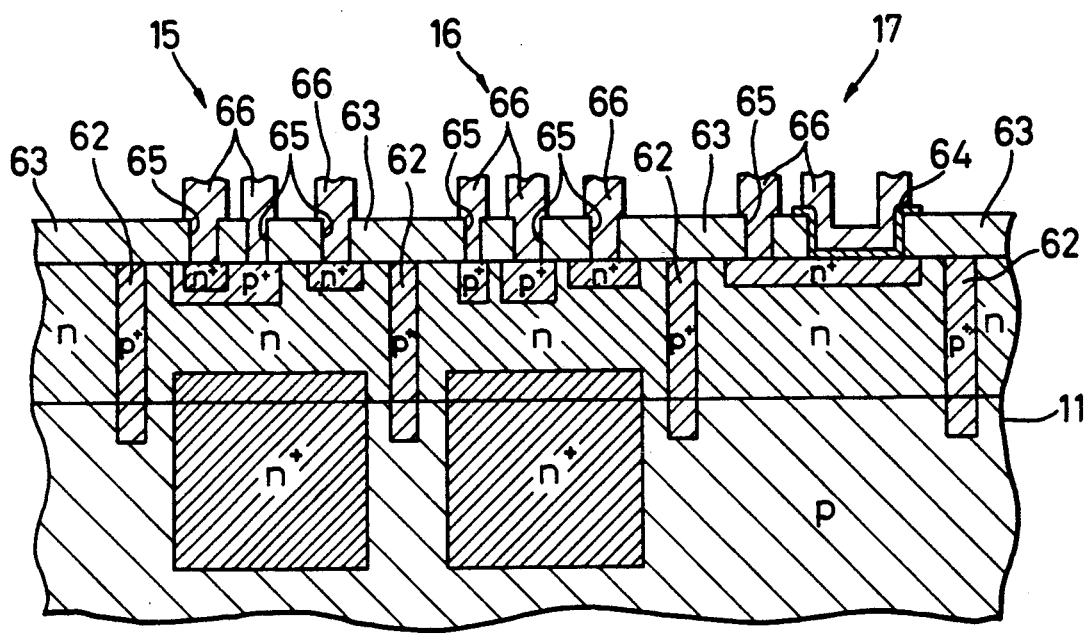
FIGS. 8 and 9 are enlarged side sectional views along the lines VIII—VIII and IX—IX of FIG. 7, respectively.

As is apparent from FIG. 8, only isolation areas 62 are formed between the each array of the internal cells 13. The conventional wiring regions are eliminated.

Figure 9:
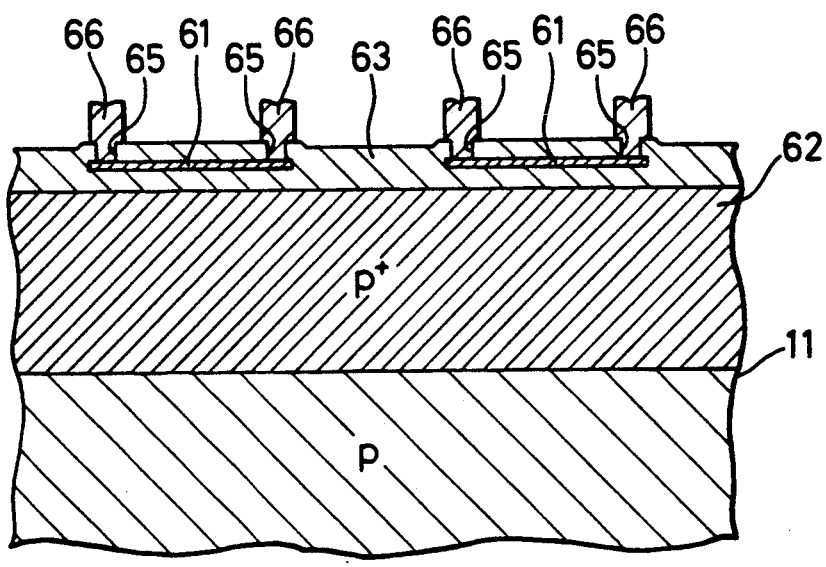

As shown in FIG. 9, the resistive elements 61 are located on the isolation areas 62 between the adjacent npn bipolar transistor elements 15 and between the adjacent pnp bipolar transistor elements 16 and are constituted by a poly-Si layer in an interlayer insulator 63.

The master slice of the first embodiment is manufactured to a state wherein only a dielectric film 64 of a MIS capacitive element 17 is exposed from the interlayer insulator 63.

A wiring step is started from openings of electrode windows 65 for the elements 15 to 17 and 61 used in a circuit. Wiring layers 66 pass on the isolation area 62 and the elements 15 to 17 and 61 which do not have any electrode windows because these elements are not used in the circuit.

The first embodiment exemplifies the semiconductor integrated circuit device of bipolar master slice approach. However, the present invention is also applicable to a semiconductor integrated circuit device of Bi-MOS master slice approach which comprises internal cells 13 obtained by repeatedly forming elements 15 to 17 and 61 and MOS transistors, or a semiconductor integrated circuit device of a Bi-CMOS master slice approach which has CMOS transistors in place of the MOS transistors.

Figure 10:
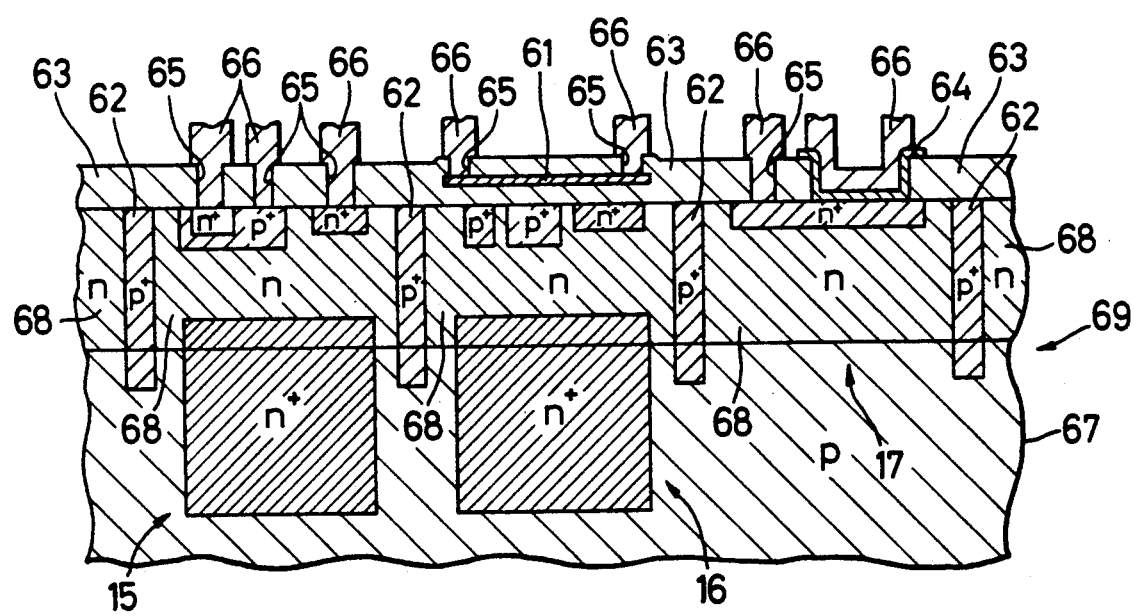
FIG. 10 is a side sectional view of the second embodiment.

The second embodiment which exemplifies a semiconductor integrated circuit device of bipolar master slice approach will be described with reference to FIG. 10.

In the master slice of the second embodiment, an npn bipolar transistor element 15, a pnp bipolar transistor element 16, and a MIS capacitive element 17 having a dielectric film 64 consisting of an SiN film are formed in a region surrounded by an isolation area 62 in a semiconductor substrate 69 consisting of a p-type semiconductor substrate 67 and an n-type epitaxial layer 68.

No resistive element is formed in the semiconductor substrate 69, and the surface of the substrate 69 is covered with an interlayer insulator 63 consisting of an $SiO_2$ film. No electrode windows are formed in the interlayer insulator 63.

In the second embodiment, circuit design is performed based on the master slice in this state. For example, if pnp bipolar transistor elements 16 are not used, resistive elements 61 consisting of poly-Si layers are formed in the interlayer insulator 63 on the pnp bipolar transistor elements 16 and the isolation area 62.

Since the resistive elements 61 are formed in the interlayer insulator 63, the resistive elements 61 can be formed at arbitrary positions without being adversely affected by the elements 15 to 17 already formed in the semiconductor substrate 69 unless they interfere the next wiring operation.

The length and width of the resistive element 61 can be arbitrarily determined, and a dose of an impurity during formation of the resistive element 61 can be changed. In addition, a mask can be added to locally change the dose of the impurity. Therefore, the resistances of the resistive elements 61 can also be arbitrarily determined.

Electrode windows 65 for elements to be used are formed, and wiring layers 66 are then formed.

In the second embodiment described above, resistive elements need not be formed in the semiconductor substrate 69. As compared with the case wherein resistive elements 61 are formed in the semiconductor substrate 69, the density of the elements 15 to 17 can be increased to twice or more although an increase in density depends on a ratio of the number of resistive elements 61 to the number of other elements 15 to 17.

In addition, since the layout of the resistive elements 61 and their resistances can be optimized in each individual circuit, the circuit layout can be facilitated.

The second embodiment exemplifies the semiconductor integrated circuit device of bipolar master slice approach. However, the present invention is also applicable to a semiconductor integrated circuit device of Bi-MOS or Bi-CMOS master slice approach.

The third and fourth embodiments which exemplify semiconductor integrated circuit devices of Bi-CMOS master slice approach will be described with reference to FIGS. 11 and 12, respectively.

Figure 11:
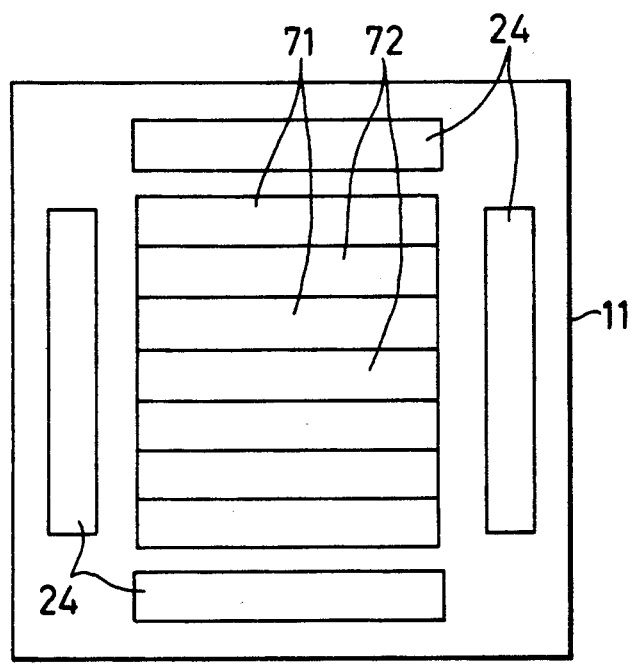
FIGS. 11 and 12 are plan views of the third and fourth embodiments, respectively.

FIG. 11 shows the third embodiment. In the third embodiment, arrays of bipolar transistor elements 71 and arrays of CMOS transistor elements 72 are alternately formed without any gaps therebetween in the central portion of a semiconductor chip 11. No wiring regions are formed in the arrays of the transistor elements 71 and 72 and therebetween.

Blocks of bipolar transistor elements 24 constituting an input/output circuit are formed to surround the transistor elements 71 and 72.

In the third embodiment having the above arrangement, electrode windows of the transistor elements 71 and 72 which will be used in the circuit are formed to start wiring from these elements. No electrode windows are formed for the transistor elements 71 and 72 which are not used in the circuit. The regions on the transistor elements 71 and 72 which are not used are used as wiring regions.

Therefore, if the electrode windows are formed for only the CMOS transistor elements 72 and the regions on the arrays of the bipolar transistor elements 71 are used as a wiring region, this semiconductor chip 11 can be used as a channel type CMOS master slice.

At this time, when a ratio of the width of the array of the CMOS transistors 72 to that of the bipolar transistor elements 71 is optimized to be, e.g., 1 : 2, the same integration level as that of a channel type CMOS master slice of the same chip size can be obtained.

To the contrary, if electrode windows are formed for only the arrays of the bipolar transistor elements 71 and the regions on the arrays of the CMOS transistor elements 72 are used as wiring regions, the semiconductor chip 11 can be used as a channel type bipolar master slice.

In this case, when a ratio of the width of the array of the bipolar transistor elements 71 to that of the CMOS transistor elements 72 is optimized, the same integration level as that of a channel type bipolar master slice of the same chip size can be obtained.

In addition, the bipolar transistor elements 71 and the CMOS transistor elements 72 can be appropriately used to constitute functional blocks as combinations of the transistor elements 71 and 72.

Furthermore, the semiconductor chips 11 can be divided into several regions, and the wiring operations as described above can be performed in the individual regions to include three types of arrangements described above on one chip 11.

Figure 12:
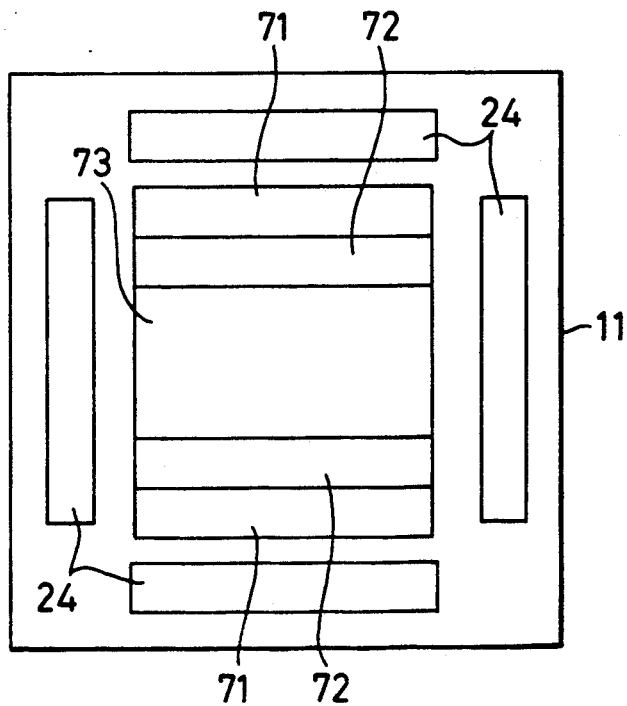

FIG. 12 shows the fourth embodiment. In the fourth embodiment, only CMOS transistor elements 73 are formed without gaps therebetween in the central portion of a semiconductor chip 11. The arrays of bipolar transistors 71 and the arrays of CMOS transistor elements 72 are alternately formed adjacent to both sides of the CMOS transistor elements 73.

In the fourth embodiment, since a wiring region can be eliminated from a memory, if the memory is constituted by the CMOS transistor elements 73, the CMOS transistor elements 73 can be effectively used.

In either of the third and fourth embodiments, the CMOS transistor elements 72 are used together with the bipolar transistor elements 71. MOS transistor elements may be used in place of the CMOS transistor elements 72.

The fifth embodiment which exemplifies a method of manufacturing the semiconductor device shown in FIG. 5 will be described with reference to FIGS. 13A to 13E.

Figure 1:
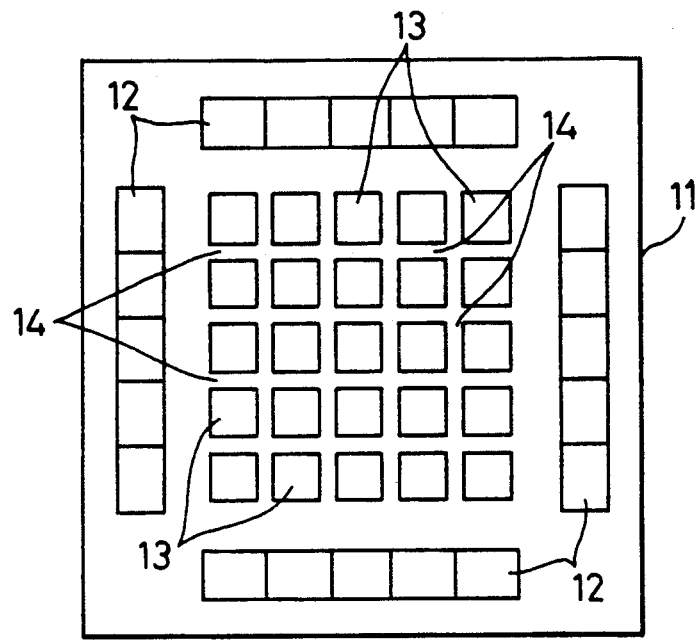
FIG. 1 is a plan view of the first conventional example.
Figure 2:
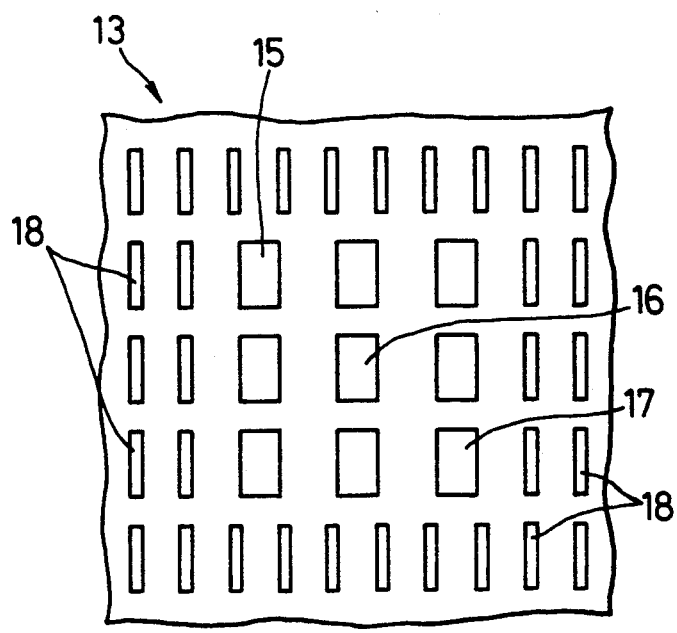
FIG. 2 is an enlarged plan view of the main part of the first conventional example.
Figure 3:
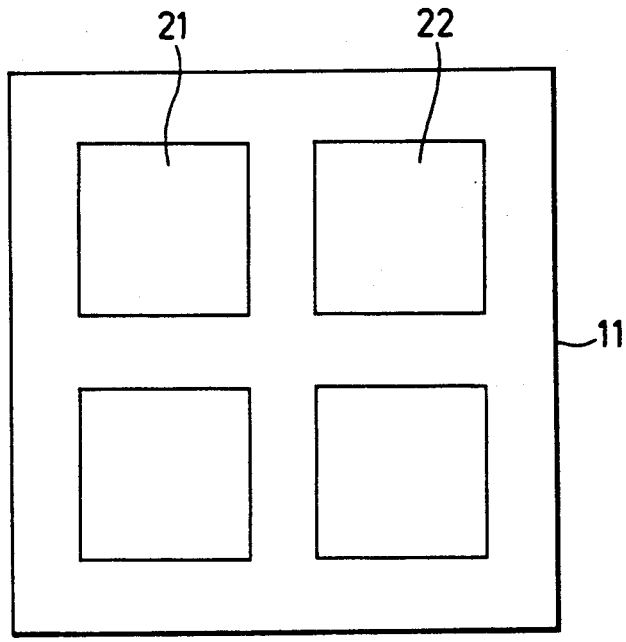
FIGS. 3 and 4 are plan views of second and third conventional examples, respectively.
Figure 4:
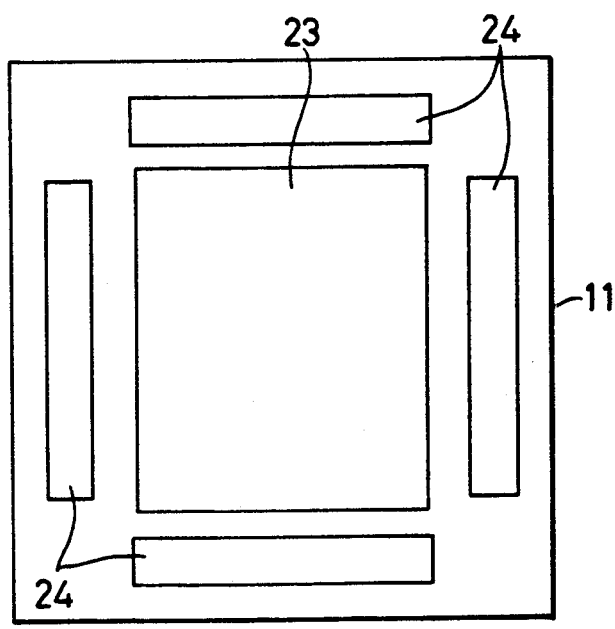
Figure 5:
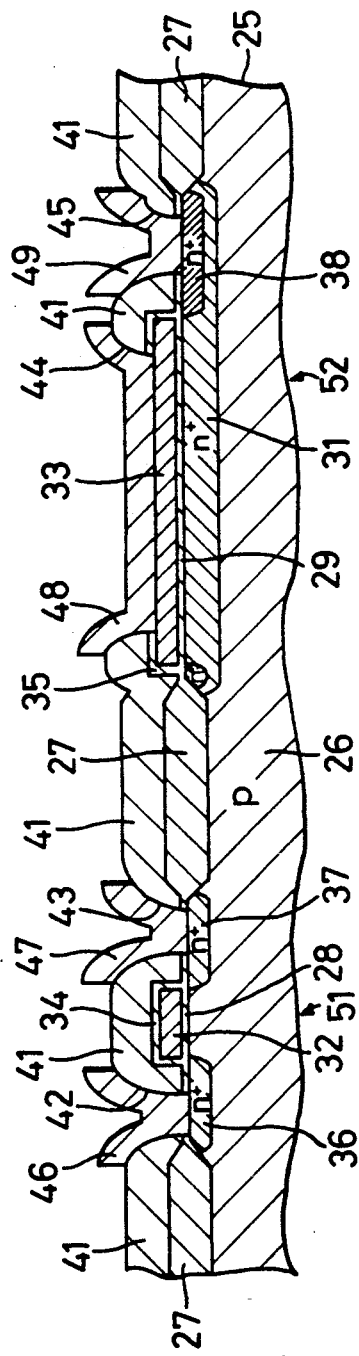
FIG. 5 is a side sectional view showing a semiconductor device manufactured by a fourth conventional example.

In the fifth embodiment, as shown in FIG. 13A, the steps up to formation of an $SiO_2$ film 28 serving as a gate oxide are the same as those in FIG. 5. In patterning of a first poly-Si layer, only a poly-Si layer 32 serving as a gate electrode is formed.

The surface of the poly-Si layer 32 and an Si substrate 25 are oxidized to form $SiO_2$ films 34 and 29. Since an $SiO_2$ film formed on an active region for a MIS capacitive element 52 upon formation of the $SiO_2$ film 28 is etched to some extent during patterning of the poly-Si layer 32, the $SiO_2$ film 29 is formed again to use it as an insulating film of the MIS capacitive element 52.

In this state, an impurity is ion-implanted to simultaneously form $n^+$-type regions 36, 37 and 31, as shown in FIG. 13B.

As shown in FIG. 13C, a second poly-Si layer 33 is deposited on the entire surface of the Si substrate 25 by CVD (Chemical Vapor Deposition). In this case, after a poly-Si layer 33 is deposited, an impurity is doped in the poly-Si layer 33. Alternatively, an impurity-doped poly-Si layer 33 is deposited. In this manner, the poly-Si layer 33 is caused to contain an impurity.

Figures 13D, 13E:
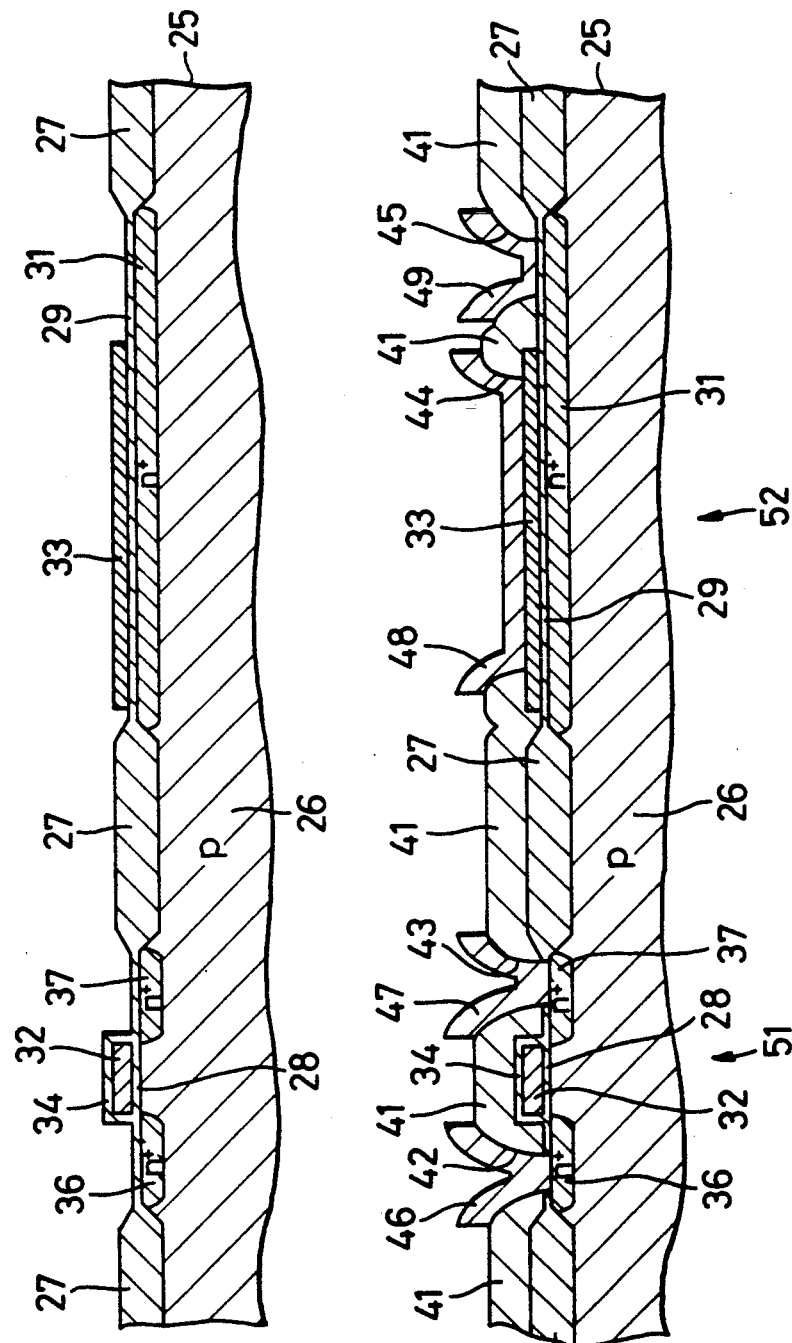

The poly-Si layer 33 is patterned to form the other electrode of the MIS capacitive element 52 and a resistive element (not shown), as shown in FIG. 13D. Note that the capacitance of the MIS capacitive element 52 is determined by the area of the poly-Si layer 33 constituting the other electrode of the MIS capacitive element 52.

Thereafter, as shown in FIG. 13E, an interlayer insulator 41 and electrode windows 42 to 45 are formed, and Al wiring layers 46 to 49 are patterned to define the MOS transistor element 51, the MIS capacitive element 52, and the resistive element (not shown) in the same manner as in FIG. 5.

Even if the semiconductor device described above is a Bi-CMOS master slice, if wiring is started from a patterning of the second poly-Si layer 33, the capacitance of the MIS capacitive element 52 is determined by the area of the poly-Si layer 33. Therefore, the MIS capacitive element 52 having any capacitance smaller than a basic capacitance can be formed.

What is claimed is:

1. A master slice semiconductor integrated circuit device which includes bipolar transistor elements as basic components, wherein
   electrode windows to perform electrical connections are formed for certain of said bipolar transistor elements which are used in a circuit, and
   areas on some of said bipolar transistor elements which do not have electrode windows and which are not used in the circuit serving as areas where wiring is employed.

2. A master slice semiconductor integrated circuit device which includes bipolar transistor elements as basic elements, wherein
   at least resistor elements are formed directly over isolation areas between said bipolar transistor elements in an insulating layer overlying the isolation areas.

3. A device according to claim 2, wherein areas on resistor elements which are not used serve as wiring areas.

4. A master slice semiconductor integrated circuit device which includes bipolar transistor elements as basic elements, wherein
   electrode windows to perform electrical connections are formed for certain of said bipolar transistor elements which are used in a circuit, and
   resistive elements are formed on at least some of said bipolar transistor elements which do not have electrode windows and which are not used in the circuit.

5. A master slice semiconductor integrated circuit device which includes bipolar and MOS transistor elements as basic elements, wherein
   electrode windows to perform electrical connections are formed for certain of said basic transistor elements which are used in a circuit,
   arrays of said bipolar transistor elements and arrays of said MOS transistor elements being alternately arranged on at least a part of a semiconductor chip, and
   wiring for said elements which have electrode windows overlying at least some of the basic transistor elements which do not have electrode windows.

6. A device according to claim 5, wherein blocks of input/output bipolar transistor elements surround said arrays of said bipolar and MOS transistor elements on the semiconductor chip.

7. A device according to claim 5, wherein a block of said MOS transistor elements is formed in a central portion of said semiconductor chip, and
   said arrays of said bipolar and MOS transistor elements are formed directly adjoining sides of said block of MOS transistor elements.

8. A master slice semiconductor integrated circuit, comprising:
   a plurality of bipolar transistor elements arranged on a substrate and isolated from one another by isolation areas;
   an interlayer insulation overlying the bipolar elements;
   some of said transistor elements being connected in an active circuit via wiring members passing through electrode windows associated with those transistor elements; and
   said wiring members for said at least some transistor elements also directly overlying at least some of a remainder of the transistor elements which are not connected in the active circuit and thus are not active, whereby areas solely devoted to wiring members between the transistor elements are not needed.

9. A circuit according to claim 8 wherein the bipolar transistor elements include npn bipolar transistor elements and pp transistor elements, wherein MIS capacitor elements are provided separated by isolation areas from the bipolar transistor elements, wherein resistive elements are provided for the bipolar transistor elements and which are adjacent respective bipolar transistor elements and which overlie the isolation areas, wherein for those transistor elements, resistive elements, and capacitor elements which are wired in the circuit electrode windows are provided, and wherein the wiring members overlie at least some of a remainder of the bipolar transistor elements, capacitor elements, and resistive elements which are not connected in the active circuit.

10. A master slice semiconductor integrated circuit, comprising:
    a plurality of bipolar transistor elements arranged at a surface of a substrate and separated by isolation areas;
    an inter layer insulation overlying the bipolar transistor elements;
    electrode windows formed through the insulation layer to certain of said bipolar transistor which are used in an active circuit, and wiring members passing through the electrode windows connecting to the bipolar transistor elements in the active circuit; and resistive elements formed in the insulation layer overlying at least some of said bipolar transistor elements which do not have electrode windows and which are not used in the active circuit.

11. A circuit according to claim 10 wherein the bipolar transistor elements comprise npn bipolar transistor elements and pnp transistor elements, and wherein MIS capacitor elements are also provided which are surrounded by isolation areas, and wherein wiring members for bipolar transistor elements and capacitor elements which are connected in the circuit directly overlie at least some of said bipolar transistor elements or MIS capacitor elements which do not have electrode windows and which are not used in the active circuit.

12. A master slice semiconductor integrated circuit, comprising:

a substrate having a plurality of bipolar and MOS transistor elements thereon;

an insulating layer overlying the transistor elements;

electrode windows formed through the insulating layer at certain of said transistor elements which are used in an active circuit and circuit wiring connecting to those transistor elements through the electrode windows;

arrays of said bipolar transistor elements and arrays of said MOS transistor elements being alternately arranged on at least a part of a semiconductor chip; and said circuit wiring for said elements which have electrode windows and which are used in an active circuit overlying at least some of the transistor elements which do not have electrode windows.

13. A circuit according to claim 12 wherein input-/output bipolar transistor elements are provided at sides of said arrays of bipolar and MOS transistor elements.

* * * * *